(12) United States Patent
Yao et al.

(10) Patent No.: US 10,886,338 B2
(45) Date of Patent: Jan. 5, 2021

(54) TOUCH PANEL, METHOD FOR DRIVING THE SAME, AND TOUCH DEVICE

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventors: Liqing Yao, Beijing (CN); Zongxiang Li, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/394,471

(22) Filed: Apr. 25, 2019

(65) Prior Publication Data

US 2020/0052043 A1 Feb. 13, 2020

(30) Foreign Application Priority Data

Aug. 9, 2018 (CN) .......................... 2018 1 0902863

(51) Int. Cl.
*G06F 3/044* (2006.01)
*H01L 27/32* (2006.01)
*H01L 51/52* (2006.01)
*G06F 3/041* (2006.01)
*G09G 3/3208* (2016.01)

(52) U.S. Cl.
CPC .......... *H01L 27/323* (2013.01); *G06F 3/0412* (2013.01); *G09G 3/3208* (2013.01); *H01L 51/5206* (2013.01); *H01L 51/5221* (2013.01); *H01L 51/5246* (2013.01); *G06F 2203/04103* (2013.01); *H01L 51/5271* (2013.01)

(58) Field of Classification Search
CPC ................... G06F 3/0412; G06F 3/044; G06F 2203/04103; G06F 2203/04111; G06F 2203/04107; G06F 3/047; G06F 3/041; G06F 3/0443; G06F 3/04164; G06F 3/04166; G06F 3/0445; G06F 2203/04104; G06F 3/0488; G09G 2300/0861; G09G 2300/0426
USPC ......... 345/173–175; 178/18.01–18.03, 18.06
See application file for complete search history.

(56) References Cited

U.S. PATENT DOCUMENTS

| | | | |
|---|---|---|---|
| 2013/0306946 A1* | 11/2013 | Chang | H01L 27/323 257/40 |
| 2017/0221971 A1* | 8/2017 | Shen | H01L 51/5221 |
| 2017/0228079 A1* | 8/2017 | Kurasawa | G02F 1/136286 |

(Continued)

*Primary Examiner* — Duc Q Dinh
(74) *Attorney, Agent, or Firm* — Brooks Kushman P.C.

(57) ABSTRACT

A touch panel, a method for driving the same, and a touch device are provided. The touch panel includes a first substrate and a second substrate arranged opposite to the first substrate. The first substrate includes a first base substrate, a first electrode layer, a first display layer and a second electrode layer laminated one on another, and the second electrode layer is arranged adjacent to the second substrate and multiplexed as a first touch electrode. The second substrate includes a second base substrate and a second touch electrode arranged at a side of the second base substrate adjacent to the first substrate. A spacer is arranged between the second electrode layer and the second touch electrode.

18 Claims, 4 Drawing Sheets

(56) References Cited

U.S. PATENT DOCUMENTS

2017/0358637 A1* 12/2017 Lee .................... H01L 27/3251
2018/0113544 A1* 4/2018 Omata .................... G06F 3/045

* cited by examiner

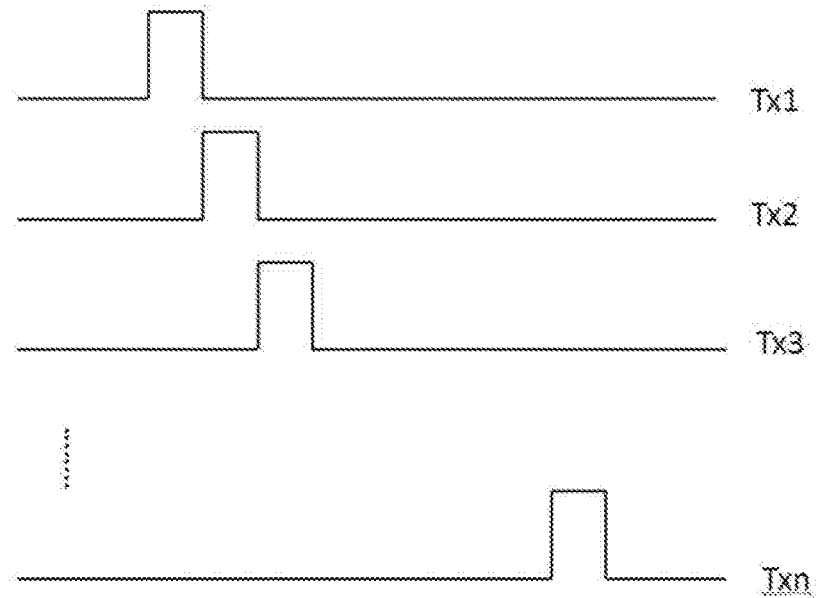

Fig. 5

At a display stage, applying a first display signal to a second electrode layer, and applying a second display signal to a second touch electrode ⸺ 601

At a touch stage, applying a touch driving signal to the second electrode layer and detecting a touch sensing signal on the second touch electrode, or applying a touch driving signal to the second touch electrode and detecting a touch sensing signal on the second electrode layer, and determining a touch position in accordance with the touch driving signal and the touch sensing signal ⸺ 602

Fig. 6

TOUCH PANEL, METHOD FOR DRIVING THE SAME, AND TOUCH DEVICE

CROSS-REFERENCE TO RELATED APPLICATION

This application claims priority to Chinese Patent Application No. 201810902863.6 filed on Aug. 9, 2018, which is incorporated herein by reference in its entirety.

TECHNICAL FIELD

The present disclosure relates to the field of touch technology, in particular to a touch panel, a method for driving the same, and a touch device.

BACKGROUND

As one of the market-available key intelligent display technologies, a touch technology includes On-Cell, In-Cell and One Glass Solution (OGS) implemented as a capacitive, resistive or infrared type. In addition, as a self-luminescence technology, an Organic Light-Emitting Diode (OLED) technology is adopted to remarkably reduce a thickness of a display device and facilitate the flexible display.

Hence, there is an urgent need to provide a scheme for integrating a touch function into an OLED display product.

SUMMARY

An object of the present disclosure is to provide a touch panel, a method for driving the same, and a touch device, so as to provide an OLED display product with a touch function.

In one aspect, the present disclosure provides in some embodiments a touch panel, including a first substrate and a second substrate arranged opposite to the first substrate. The first substrate includes a first base substrate, a first electrode layer, a first display layer and a second electrode layer laminated one on another, and the second electrode layer is arranged adjacent to the second substrate and multiplexed as a first touch electrode. The second substrate includes a second base substrate and a second touch electrode arranged at a side of the second base substrate adjacent to the first substrate. A spacer is arranged between the second electrode layer and the second touch electrode.

In a possible embodiment of the present disclosure, the second substrate further includes a third electrode layer and a second display layer both arranged between the second base substrate and the second touch electrode, the second display layer is arranged adjacent to the second touch electrode, and the second touch electrode is multiplexed as a fourth electrode layer corresponding to the third electrode layer.

In a possible embodiment of the present disclosure, the second display layer includes a second hole transport layer, a second organic light-emitting layer and a second electron transport layer laminated one on another, the third electrode layer is an anode layer, and the second hole transport layer is arranged adjacent to the third electrode layer.

In a possible embodiment of the present disclosure, the second display layer include a second hole transport layer, a second organic light-emitting layer and a second electron transport layer laminated one on another, the third electrode layer is a cathode layer, and the second electron transport layer is arranged adjacent to the third electrode layer.

In a possible embodiment of the present disclosure, the first display layer includes a first hole transport layer, a first organic light-emitting layer and a first electron transport layer laminated one on another, the first electrode layer is an anode layer, and the first hole transport layer is arranged adjacent to the first electrode layer.

In a possible embodiment of the present disclosure, the first display layer includes a first hole transport layer, a first organic light-emitting layer and a first electron transport layer laminated one on another, the first electrode layer is a cathode layer, and the first electron transport layer is arranged adjacent to the first electrode layer.

In a possible embodiment of the present disclosure, the first substrate further includes a reflection layer arranged between the first base substrate and the first electrode layer.

In a possible embodiment of the present disclosure, the second substrate further includes a reflection layer arranged between the second base substrate and the second touch electrode.

In a possible embodiment of the present disclosure, the second substrate further includes a reflection layer arranged between the second base substrate and the third electrode layer.

In a possible embodiment of the present disclosure, the second electrode layer includes a plurality of strip-like structures each extending in a first direction, and the second touch electrode includes a plurality of strip-like structures each extending in a second direction perpendicular to the first direction.

In a possible embodiment of the present disclosure, the touch panel further includes a plurality of pixel units, a width of each strip-like structure of the second electrode layer is equal to a width of one or more pixel units, and a distance between every two adjacent strip-like structures is the same as a distance between two adjacent pixel units in the second direction.

In a possible embodiment of the present disclosure, the touch panel further includes a plurality of pixel units, a width of each strip-like structure of the second touch electrode is equal to a width of one or more pixel units, and a distance between every two adjacent strip-like structures is the same as a distance between two adjacent pixel units in the first direction.

In a possible embodiment of the present disclosure, the first electrode layer, the second electrode layer, the third electrode layer and the second touch electrode are each made of a transparent material.

In a possible embodiment of the present disclosure, the touch panel further includes a packaging layer arranged between a peripheral region of the first base substrate and a peripheral region of the second base substrate.

In a possible embodiment of the present disclosure, the spacer is made of an insulation material.

In another aspect, the present disclosure provides in some embodiments a touch device including the above-mentioned touch panel.

In yet another aspect, the present disclosure provides in some embodiments a method for driving the above-mentioned touch panel, including: at a display stage, applying a first display signal to the second electrode layer, and applying a second display signal to the second touch electrode; and at a touch stage, applying a touch driving signal to the second electrode layer and detecting a touch sensing signal on the second touch electrode, or applying a touch driving signal to the second touch electrode and detecting a touch sensing signal on the second electrode layer, and determining a touch position in accordance with the touch driving signal and the touch sensing signal.

In a possible embodiment of the present disclosure, the first display signal is the same as the second display signal.

In a possible embodiment of the present disclosure, the second electrode layer and the second touch electrode each includes a plurality of strip-like structures, the touch driving signal is a shift register signal applied to each strip-like structure of the second electrode layer or the second touch electrode.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

FIG. 5 is a time sequence diagram of a touch driving signal according to one embodiment of the present disclosure;

FIG. 6 is a flow chart of a method for driving the touch panel according to one embodiment of the present disclosure;

DETAILED DESCRIPTION

In order to make the objects, the technical solutions and the advantages of the present disclosure more apparent, the present disclosure will be described hereinafter in a clear and complete manner in conjunction with the drawings and embodiments.

Figure 1:
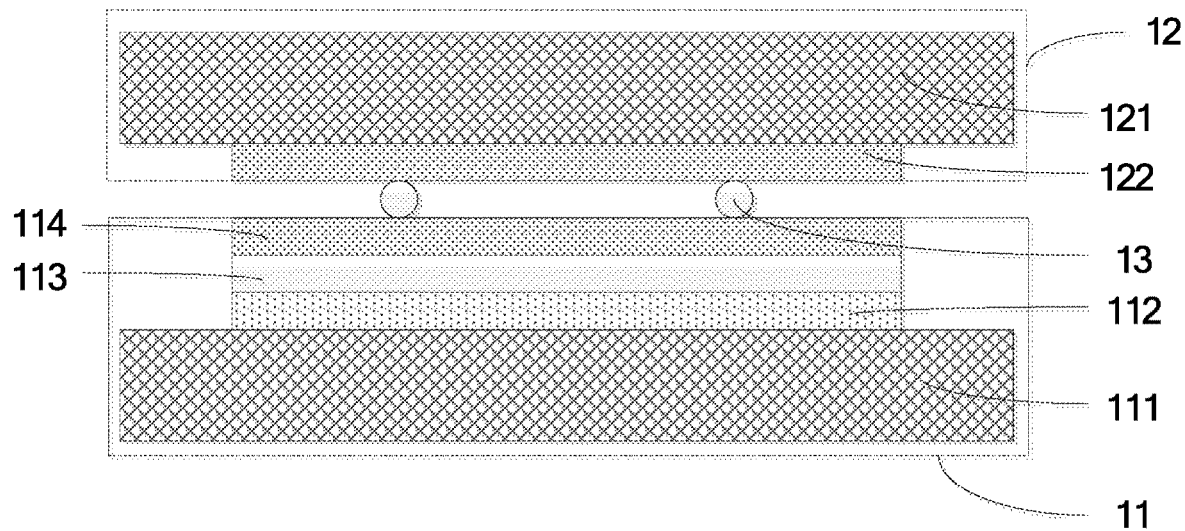
FIG. 1 is a sectional view of a touch panel according to one embodiment of the present disclosure.

The present disclosure provides in some embodiments a touch panel which, as shown in FIG. 1, includes a first substrate 11 and a second substrate 12 arranged opposite to the first substrate 11. The first substrate 11 includes a first base substrate 111, a first electrode layer 112, a first display layer 113 and a second electrode layer 114 laminated one on another, and the second electrode layer 114 is arranged adjacent to the second substrate 12 and multiplexed as a first touch electrode. The second substrate 12 includes a second base substrate 121 and a second touch electrode 122 arranged at a side of the second base substrate 121 adjacent to the first substrate 11. A spacer 13 is arranged between the second electrode layer 114 and the second touch electrode 122.

To be specific, the first display layer 113 may include an organic light-emitting layer, the first electrode layer 112 may be one of an anode layer and a cathode layer of the first substrate 11, and the second electrode layer 114 may be the other of the anode layer and the cathode layer of the first substrate 11. The first display layer 113 is configured to emit light under the effect of a driving current generated between the first electrode layer 112 and the second electrode layer 114.

At a display stage, a display signal may be applied to the second electrode layer 114 and the second touch electrode 122. At a touch stage, a touch driving signal may be applied to the second electrode layer 114. When a touch operation is being made on the touch panel, the second electrode layer 114 may be in contact with the second touch electrode 122 at a touch position. At this time, through monitoring a touch sensing signal on the second touch electrode 122, a peripheral Integrated Circuit (IC) may determine the touch position in accordance with the touch driving signal and the detected touch sensing signal. Of course, the touch driving signal may also be applied to the second touch electrode 122, and then the touch position may be determined through monitoring the touch sensing signal on the second electrode layer 114.

The second electrode layer 114 may be of a strip-like structure or a plane-like structure, and the second touch electrode 122 may also be of a strip-like structure or a plane-like structure. To be specific, a structure of each of the second electrode layer 114 and the second touch electrode 122 may be designed according to the practical need and a driving signal, and thus will not be particularly defined herein.

The spacer 13 arranged between the second electrode layer 114 and the second touch electrode 122 may be made of an insulation material.

According to the touch panel in the embodiments of the present disclosure, the second electrode layer is multiplexed as the first touch electrode, so as to integrate a display function and a touch function in an OLED display product through the second electrode layer in combination with the second touch electrode. In addition, the first substrate is arranged opposite to the second substrate to form a cell, so it is able to reduce the difficulty in the formation of the layers.

Figure 2:
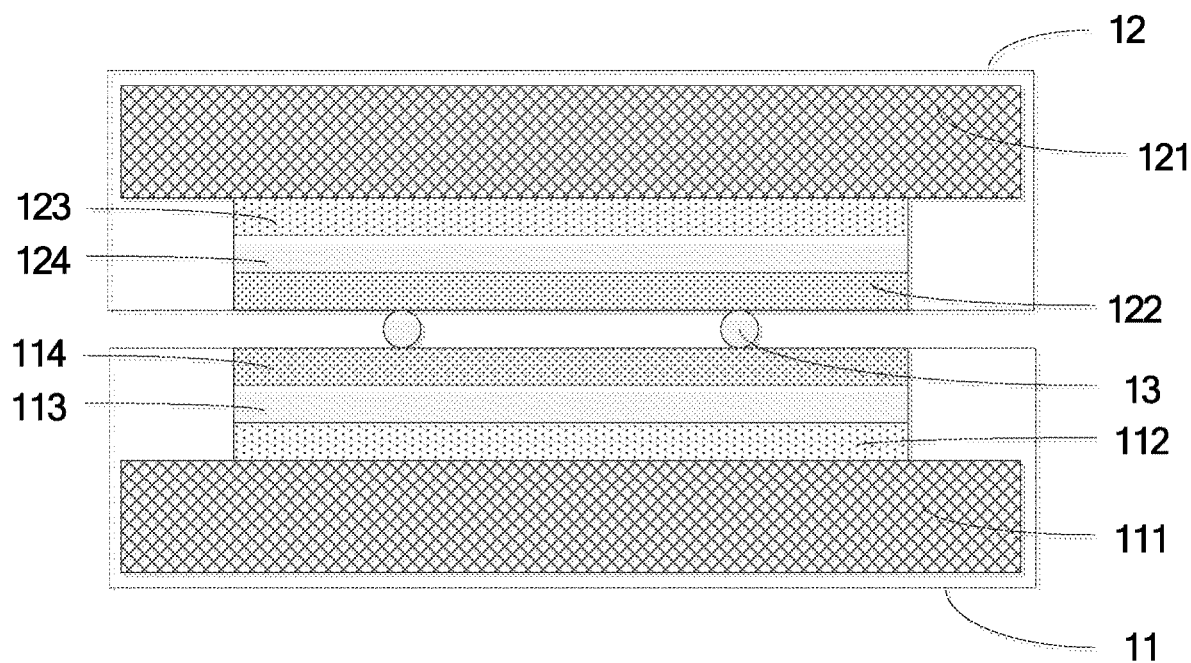
FIG. 2 is another sectional view of the touch panel according to one embodiment of the present disclosure.

As shown in FIG. 2, the second substrate 12 may further include a third electrode layer 123 and a second display layer 124 both arranged between the second base substrate 121 and the second touch electrode 122, the second display layer 124 may be arranged adjacent to the second touch electrode 122, and the second touch electrode 122 may be multiplexed as a fourth electrode layer corresponding to the third electrode layer 123.

To be specific, the second display layer 124 may include an organic light-emitting layer, the third electrode layer 123 may be one of an anode layer and a cathode layer of the second substrate 12, and the second touch electrode 122, i.e., the fourth electrode layer, may be the other of the anode layer and the cathode layer corresponding to the third electrode layer 123. The second display layer 124 is configured to emit light under the effect of a driving current generated between the third electrode layer 123 and the second touch electrode 122.

According to the touch panel in the embodiments of the present disclosure, the first substrate and the second substrate are each an OLED substrate, the second electrode layer of the first substrate is multiplexed as the first touch electrode, and the second touch electrode of the second substrate is multiplexed as the fourth electrode layer. As a result, it is able to provide the OLED display product with a touch function without any additional layer. In addition, the two OLED substrates are arranged opposite to each other to form a cell, so as to provide the touch panel with two organic light-emitting layers, thereby to increase the brightness of the touch panel and display a colorful image.

Figure 7:
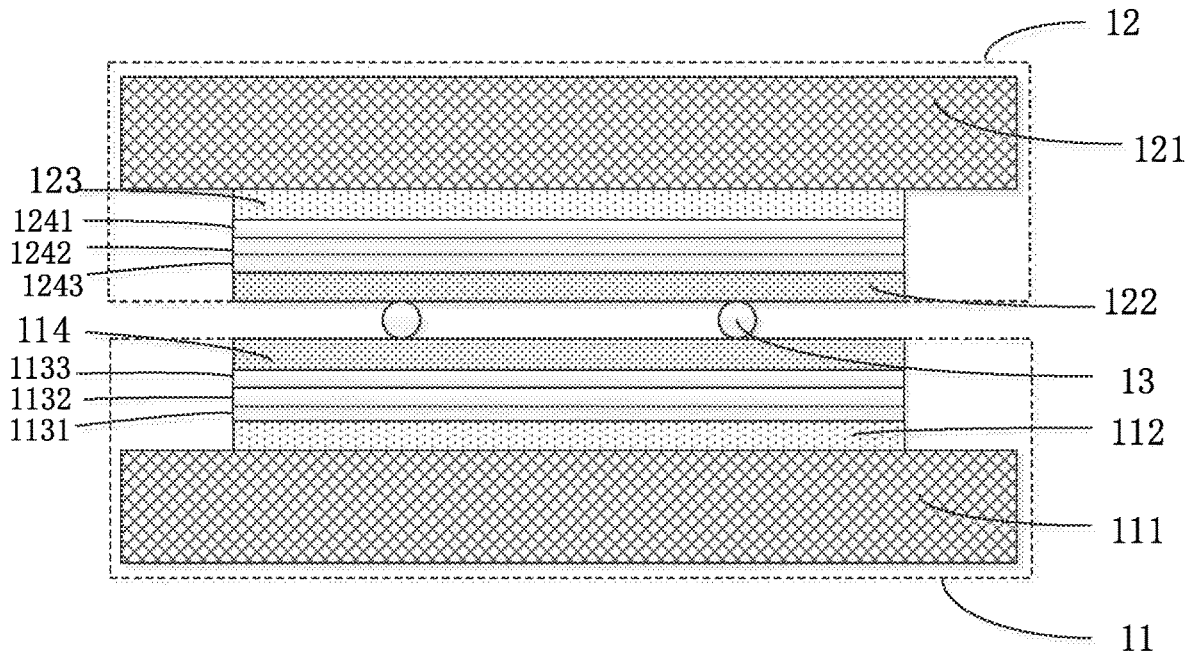
FIG. 7 is yet another sectional view of the touch panel according to one embodiment of the present disclosure.
Figure 8:
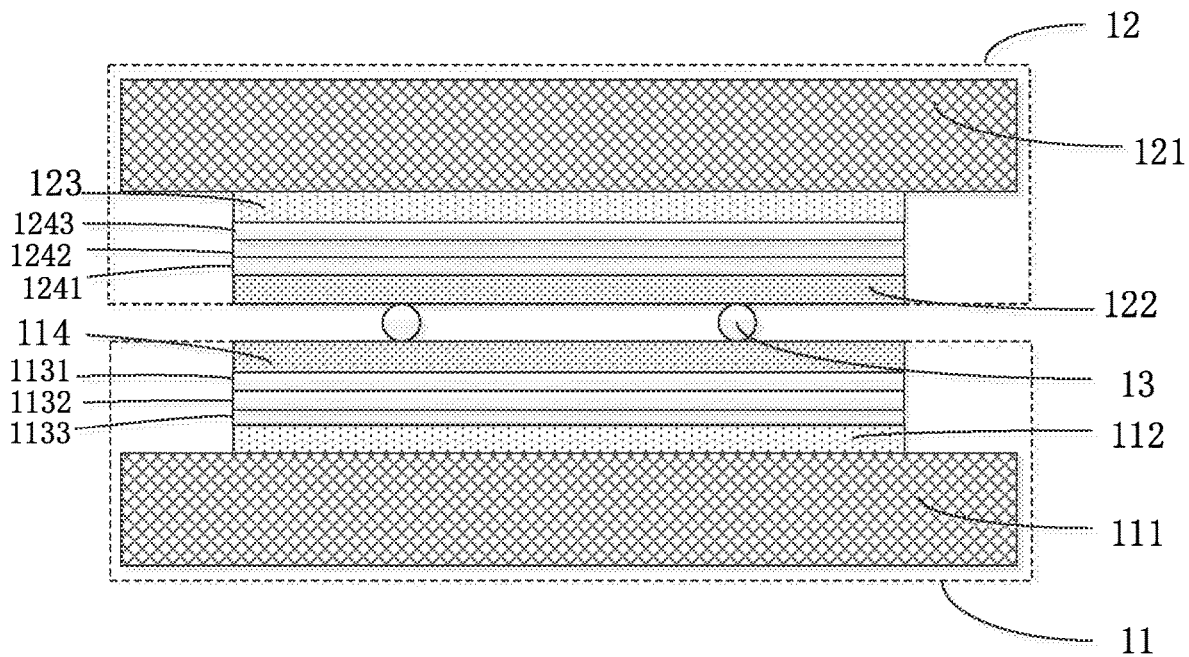
FIG. 8 is still yet another sectional view of the touch panel according to one embodiment of the present disclosure.

In actual use, the first display layer 113 may include a first hole transport layer 1131, a first organic light-emitting layer 1132 and a first electron transport layer 1133 laminated one on another. As shown in FIG. 7, when the first electrode layer 112 is the anode layer of the first substrate 11, the first hole transport layer 1131 may be arranged adjacent to the first electrode layer 112. As shown in FIG. 8, when the first electrode layer 112 is the cathode layer of the first substrate 11, the first electron transport layer 1133 may be arranged adjacent to the first electrode layer 112.

The second display layer 124 may include a second hole transport layer 1241, a second organic light-emitting layer 1242 and a second electron transport layer 1243 laminated one on another. As shown in FIG. 7, when the third electrode layer 123 is the anode layer of the second substrate 12, the second hole transport layer 1241 may be arranged adjacent to the third electrode layer 123. As shown in FIG. 8, when the third electrode layer 123 is the cathode layer of the second substrate 12, the second electron transport layer 1243 may be arranged adjacent to the third electrode layer 123.

Figure 3:
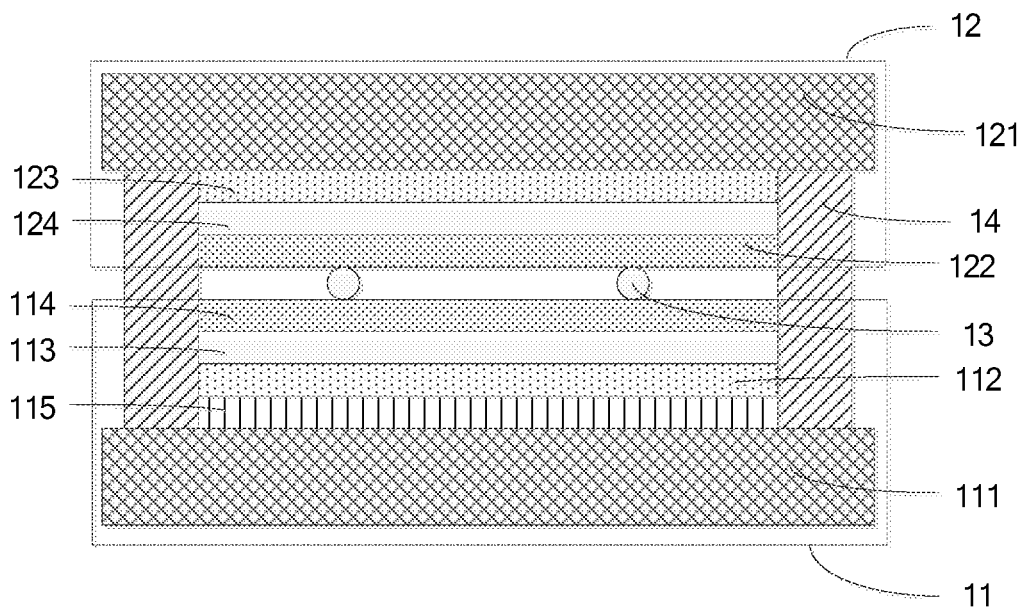
FIG. 3 is a sectional view of the touch panel including a reflection layer and a packaging layer according to one embodiment of the present disclosure.

As shown in FIG. 3, the first substrate 11 may further include a reflection layer 115 arranged between the first base substrate 111 and the first electrode layer 112, so as to merely allow the light to exit from one side of the second substrate 12. Of course, the reflection layer 115 may also be arranged between the second base substrate 121 and the second touch electrode 122, or between the second base substrate 121 and the third electrode layer 123, so as to merely allow the light to exit from one side of the first substrate 11.

In order to improve the light transmission efficiency, the first electrode layer 112, the second electrode layer 114, the third electrode layer 123 and the second touch electrode 122 may each be made of a transparent material, e.g., indium tin oxide (ITO).

In order to isolate the organic light-emitting layers of the first substrate 11 and the second substrate 12 from oxygen and moisture, the touch panel may further include a packaging layer 14. As shown in FIG. 3, the packaging layer 14 may be arranged between a peripheral region of the first base substrate 111 and a peripheral region of the second base substrate 121. In other words, the packaging layer 14 may be filled between the peripheral region of the first base substrate 111 and the peripheral region of the second base substrate 121, so as to protect the first electrode layer 112, the first display layer 113, the second electrode layer 114, the third electrode layer 123, the second display layer 124 and the second touch electrode 122 from being oxidized and corroded, thereby to improve the reliability of the touch panel.

Figure 4:
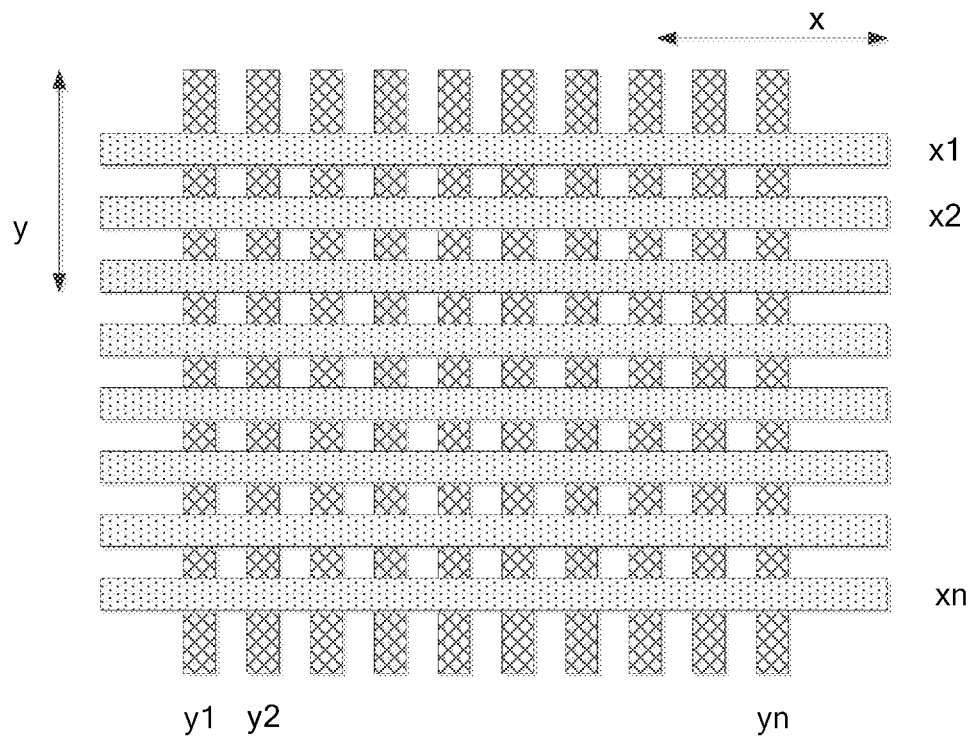
FIG. 4 is a planar view of a second cathode layer and a second touch electrode each including a plurality of strip-like structures according to one embodiment of the present disclosure.

In a possible embodiment of the present disclosure, as shown in FIG. 4, the second electrode layer 114 may include a plurality of strip-like structures x1, x2, . . . , xn extending in a first direction x, and the second touch electrode 122 may include a plurality of strip-like structures y1, y2, . . . , yn extending in a second direction y perpendicular to the first direction x. It should be appreciated that, the first direction x and the second direction y will not be particularly defined herein, as long as they are perpendicular to each other. In actual use, in order to facilitate the structural design and simplify the manufacture process, the first direction x may be parallel to an extension direction of each scanning line on the first substrate 11, and the second direction y may be perpendicular to the first direction x. In addition, the first direction x may also be parallel to an extension direction of each data line on the first substrate 11, and the second direction y may be perpendicular to the first direction x.

When the second electrode layer 114 and the second touch electrode 122 are each provided with the strip-like structures, it is able to reduce the resistance, thereby to reduce a signal attenuation level.

In actual use, the touch panel may include a plurality of pixel units. A width of each strip-like structure x1, x2, . . . , xn of the second electrode layer 114 may be equal to a width of one pixel unit in the second direction y, or widths of several pixel units in the second direction y. A distance between every two adjacent strip-like structures x1, x2, . . . , xn of the second electrode layer 114 may be the same as a distance between two adjacent pixel units in the second direction y. A width of each strip-like structure y1, y2, . . . , yn of the second touch electrode 122 may be equal to a width of one pixel unit in the first direction x, or widths of several pixel units in the first direction x. A distance between every two adjacent strip-like structures y1, y2, . . . , yn of the second touch electrode 122 may be the same as a distance between two adjacent pixel units in the first direction x.

An operating procedure and a principle of the touch panel at the touch stage will be described hereinafter when the second electrode layer 114 and the second touch electrode 122 are each provided with a plurality of strip-like structures. A touch driving signal Tx may be applied to the second electrode layer 114, and then a touch sensing signal Ry on the second touch electrode 122 may be detected. FIG. 5 shows a time sequence diagram of the touch driving signal Tx.

The touch stage may be arranged between two frames of the display signal, i.e., the touch driving signal Tx may be applied to the second electrode layer 114 between the two frames of display signal. As shown in FIG. 5, the touch driving signal Tx is a shift register signal Tx1, Tx2, . . . , Txn applied to the strip-like structures x1, x2, . . . , xn of the second electrode layer 114 respectively. When a touch operation is being made, the second electrode layer 114 may be in contact with the second touch electrode 122 at a corresponding position. For example, when the strip-like structure x3 is in contact with the strip-like structure y4, the touch driving signal Tx3 applied to x3 may be transmitted to y4, and thereby a touch sensing signal Ry4 may be outputted. At this time, the peripheral IC may monitor Ry1, Ry2, . . . , Ryn, and then determine a touch position (i.e., x3 and y4) in accordance with a feature of Tx3 (e.g., time sequence information).

The present disclosure further provides in some embodiments a touch device including the above-mentioned touch panel.

It should be appreciated that, the touch device may be any product or member having a touch function, e.g., display panel, electronic paper, mobile phone, flat-panel computer, television, laptop computer, digital photo frame or navigator.

The present disclosure further provides in some embodiments a method for driving the above-mentioned touch panel which, as shown in FIG. 6, includes: Step 601 of, at a display stage, applying a first display signal to the second electrode layer, and applying a second display signal to the second touch electrode; and Step 602 of, at a touch stage, applying a touch driving signal to the second electrode layer and detecting a touch sensing signal on the second touch electrode, or applying a touch driving signal to the second touch electrode and detecting a touch sensing signal on the second electrode layer, and determining a touch position in accordance with the touch driving signal and the touch sensing signal.

According to the driving method in the embodiments of the present disclosure, the display signal and the touch signal are applied to the touch panel in a time-division manner, so as to integrate a touch function into an OLED display product.

When the second substrate further includes the third electrode layer and the second display layer both arranged between the second base substrate and the second touch electrode, the first display signal may be the same as the second display signal, so as to prevent an image displayed by the first substrate from interfering with an image displayed by the second substrate.

When each of the second electrode layer and the second touch electrode include a plurality of strip-like structures, the touch driving signal may be a shift register signal applied to each strip-like structure of the second electrode layer or the second touch electrode.

An operating procedure and a principle of the driving method applied to the touch panel may refer to those mentioned hereinabove, and thus will not be particularly defined herein.

According to the touch panel, the method for driving the same, and the touch device in the embodiments of the present disclosure, the touch panel includes the first substrate and the second substrate arranged opposite to each other. The first substrate includes the first base substrate, the first electrode layer, the first display layer and the second electrode layer laminated one on another, and the second electrode layer is arranged adjacent to the second substrate and multiplexed as the first touch electrode. The second substrate includes the second base substrate and the second touch electrode arranged at a side of the second base substrate adjacent to the first substrate. The spacer is arranged between the second electrode layer and the second touch electrode. The second electrode layer is multiplexed as the first touch electrode, so as to integrate a display function and a touch function in an OLED display product through the second electrode layer in combination with the second touch electrode. In addition, the first substrate is arranged opposite to the second substrate to form a cell, so it is able to reduce the difficulty in the formation of the layers.

The above embodiments have been described in a progressive manner, and the same or similar contents in the embodiments will not be repeated, i.e., each embodiment merely focuses on the difference from the others.

It should be appreciated that, such words as "first" and "second" are merely used to separate one entity or operation from another entity or operation, but are not necessarily used to represent or imply any relation or order between the entities or operations. In addition, such terms as "include" or "including" or any other variations involved in the present disclosure intend to provide non-exclusive coverage, so that a procedure, method, article or device including a series of elements may also include any other elements not listed herein, or may include any inherent elements of the procedure, method, article or device. If without any further limitations, for the elements defined by such sentence as "including one . . . ", it is not excluded that the procedure, method, article or device including the elements may also include any other identical elements.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A touch panel, comprising a first substrate and a second substrate arranged opposite to the first substrate, wherein,
the first substrate comprises a first base substrate, a first electrode layer, a first display layer and a second electrode layer laminated one on another, and the second electrode layer is arranged adjacent to the second substrate and multiplexed as a first touch electrode;
the second substrate comprises a second base substrate and a second touch electrode arranged at a side of the second base substrate adjacent to the first substrate; and
a spacer is arranged between the second electrode layer and the second touch electrode,
wherein the second substrate further comprises a third electrode layer and a second display layer both arranged between the second base substrate and the second touch electrode, the second display layer is arranged adjacent to the second touch electrode, and the second touch electrode is multiplexed as a fourth electrode layer corresponding to the third electrode layer.

2. The touch panel according to claim 1, wherein the second display layer comprises a second hole transport layer, a second organic light-emitting layer and a second electron transport layer laminated one on another, the third electrode layer is an anode layer, and the second hole transport layer is arranged adjacent to the third electrode layer.

3. The touch panel according to claim 1, wherein the second display layer comprise a second hole transport layer, a second organic light-emitting layer and a second electron transport layer laminated one on another, the third electrode layer is a cathode layer, and the second electron transport layer is arranged adjacent to the third electrode layer.

4. The touch panel according to claim 1, wherein the first display layer comprises a first hole transport layer, a first organic light-emitting layer and a first electron transport layer laminated one on another, the first electrode layer is an anode layer, and the first hole transport layer is arranged adjacent to the first electrode layer.

5. The touch panel according to claim 1, wherein the first display layer comprises a first hole transport layer, a first organic light-emitting layer and a first electron transport layer laminated one on another, the first electrode layer is a cathode layer, and the first electron transport layer is arranged adjacent to the first electrode layer.

6. The touch panel according to claim 1, wherein the first substrate further comprises a reflection layer arranged between the first base substrate and the first electrode layer.

7. The touch panel according to claim 1, wherein the second substrate further comprises a reflection layer arranged between the second base substrate and the second touch electrode.

8. The touch panel according to claim 1, wherein the second substrate further comprises a reflection layer arranged between the second base substrate and the third electrode layer.

9. The touch panel according to claim 1, wherein the second electrode layer comprises a plurality of strip-like structures each extending in a first direction, and the second touch electrode comprises a plurality of strip-like structures each extending in a second direction perpendicular to the first direction.

10. The touch panel according to claim 9, further comprising a plurality of pixel units, wherein a width of each strip-like structure of the second electrode layer is equal to a width of one or more pixel units, and a distance between every two adjacent strip-like structures is the same as a distance between two adjacent pixel units in the second direction.

11. The touch panel according to claim 9, further comprising a plurality of pixel units, wherein a width of each strip-like structure of the second touch electrode is equal to a width of one or more pixel units, and a distance between every two adjacent strip-like structures is the same as a distance between two adjacent pixel units in the first direction.

12. The touch panel according to claim 1, wherein the first electrode layer, the second electrode layer, the third electrode layer and the second touch electrode are each made of a transparent material.

13. The touch panel according to claim 1, further comprising a packaging layer arranged between a peripheral region of the first base substrate and a peripheral region of the second base substrate.

14. The touch panel according to claim 1, wherein the spacer is made of an insulation material.

15. A touch device, comprising the touch panel according to claim 1.

16. A method for driving the touch panel according to claim 1, comprising:
 at a display stage, applying a first display signal to the second electrode layer, and applying a second display signal to the second touch electrode; and
 at a touch stage, applying a touch driving signal to the second electrode layer and detecting a touch sensing signal on the second touch electrode, or applying a touch driving signal to the second touch electrode and detecting a touch sensing signal on the second electrode layer, and determining a touch position based on the touch driving signal and the touch sensing signal.

17. The method according to claim 16, wherein the first display signal is the same as the second display signal.

18. The method according to claim 16, wherein the second electrode layer and the second touch electrode each comprises a plurality of strip-like structures, the touch driving signal is a shift register signal applied to each strip-like structure of the second electrode layer or the second touch electrode.

* * * * *